(12) United States Patent
Fujimatsu et al.

(10) Patent No.: US 12,098,300 B2
(45) Date of Patent: Sep. 24, 2024

(54) POLISHING LIQUID AND POLISHING METHOD

(71) Applicant: Showa Denko Materials Co., Ltd., Tokyo (JP)

(72) Inventors: Ai Fujimatsu, Tokyo (JP); Mamiko Iwano, Tokyo (JP); Nao Yamamura, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 258 days.

(21) Appl. No.: 17/431,635

(22) PCT Filed: Feb. 19, 2019

(86) PCT No.: PCT/JP2019/006082
§ 371 (c)(1),
(2) Date: Aug. 17, 2021

(87) PCT Pub. No.: WO2020/170331
PCT Pub. Date: Aug. 27, 2020

(65) Prior Publication Data
US 2022/0112400 A1    Apr. 14, 2022

(51) Int. Cl.
*C09G 1/02*      (2006.01)
*H01L 21/3105*   (2006.01)

(52) U.S. Cl.
CPC .......... *C09G 1/02* (2013.01); *H01L 21/31053* (2013.01)

(58) Field of Classification Search
None
See application file for complete search history.

(56) References Cited

U.S. PATENT DOCUMENTS

| 2017/0183539 A1* | 6/2017 | Kwon | ................. H01L 21/3212 |
| 2021/0189176 A1* | 6/2021 | Kanamaru | ............... C09G 1/02 |

FOREIGN PATENT DOCUMENTS

| CN | 1727431 A | 2/2006 |
| CN | 103898510 A | 7/2014 |
| CN | 103898511 A | 7/2014 |
| CN | 103898512 A | 7/2014 |
| CN | 107949615 A | 4/2018 |
| JP | 2011-103498 A | 5/2011 |
| JP | 2016-222867 A | 12/2016 |
| KR | 10-2016-0080555 A | 7/2016 |
| KR | 10-2018-0052641 A | 5/2018 |
| KR | 10-2018-0073131 A | 7/2018 |
| TW | 200911972 A | 3/2009 |
| WO | 2009/031389 A1 | 3/2009 |
| WO | 2015/170436 A1 | 11/2015 |

* cited by examiner

*Primary Examiner* — Roberts P Culbert
(74) *Attorney, Agent, or Firm* — Fitch, Even, Tabin & Flannery LLP

(57) ABSTRACT

An aspect of the present invention is a polishing liquid containing abrasive grains, a copolymer, and a liquid medium, in which the copolymer has a structure unit derived from at least one styrene compound selected from the group consisting of styrene and a styrene derivative and a structure unit derived from acrylic acid, a content of the copolymer is more than 0.01% by mass and 0.2% by mass or less based on the total amount of the polishing liquid, and a pH of the polishing liquid is more than 4.5.

19 Claims, 1 Drawing Sheet

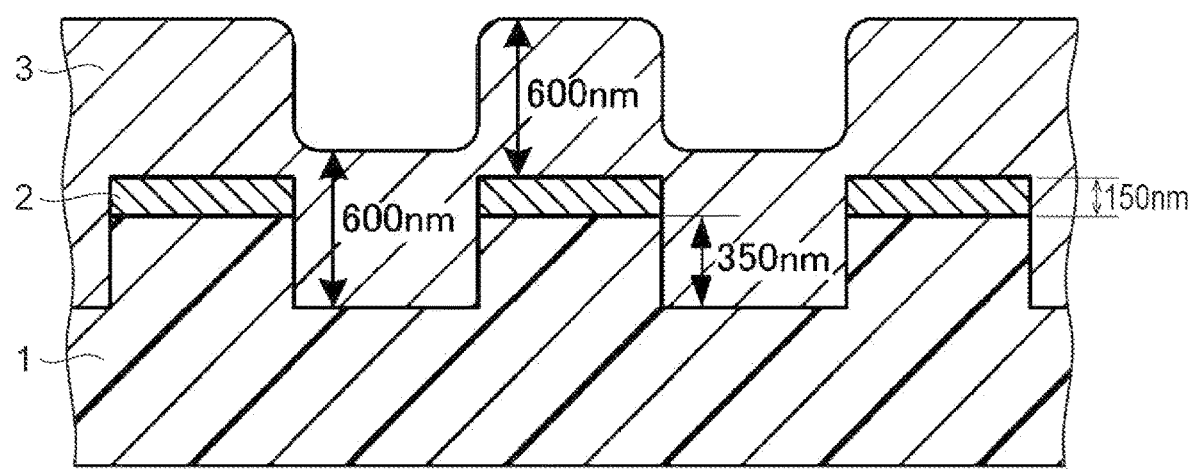

POLISHING LIQUID AND POLISHING METHOD

CROSS-REFERENCE TO RELATED APPLICATIONS

This application is a U.S. national phase application filed under 35 U.S.C. § 371 of International Application No. PCT/JP2019/006082, filed Feb. 19, 2019, designating the United States, which is hereby incorporated herein by reference in its entirety.

TECHNICAL FIELD

The present invention relates to a polishing liquid and a polishing method.

BACKGROUND ART

In recent years, processing techniques for increasing density and miniaturization are becoming ever more important in manufacturing steps for semiconductor elements. CMP (Chemical Mechanical Polishing) technique that is one of processing techniques has become an essential technique in manufacturing steps for semiconductor elements, for STI formation, flattening of pre-metal insulating films or interlayer insulating films, formation of plugs or embedded metal wirings, or the like.

In a CMP step or the like for formation of STI, polishing of a laminate, which has a stopper (a polishing stop layer containing a stopper material) disposed on the convex portion of a substrate having a concavo-convex pattern and an insulating member (for example, an insulating film such as a silicon oxide film) disposed on the substrate and the stopper so as to fill the concave portion of the concavo-convex pattern, is performed. In such polishing, polishing of the insulating member is stopped by the stopper. That is, polishing of the insulating member is stopped when the stopper is exposed. The reason for this is that the amount of the insulating material polished (the amount of the insulating material removed) contained in the insulating member is difficult to artificially control, and thus the insulating member is polished until the stopper is exposed, thereby controlling the degree of polishing. In this case, the polishing selectivity of the insulating material with respect to the stopper material (polishing rate ratio: a polishing rate for the insulating material/a polishing rate for the stopper material) is required to be increased.

For this problem, Patent Literature 1 described below discloses that the polishing selectivity of silicon oxide with respect to polysilicon is improved by using a copolymer of styrene and acrylonitrile. Patent Literature 2 described below discloses that the polishing selectivity of the insulating material with respect to silicon nitride is improved by using a polishing liquid containing ceria particles, a dispersant, a specific water-soluble polymer, and water.

CITATION LIST

Patent Literature

Patent Literature 1: International Publication WO 2015/170436
Patent Literature 2: Japanese Unexamined Patent Publication No. 2011-103498

SUMMARY OF INVENTION

Technical Problem

In semiconductor devices in recent years, miniaturization has been further accelerated, and thinning has progressed along with the reduction in wiring width. Along with this, in the CMP step or the like for formation of STI, it is necessary to polish the insulating member while suppressing excessive polishing of the stopper disposed on the convex portion of the substrate having a concavo-convex pattern. From such a viewpoint, it is required for the polishing liquid to further improve the polishing selectivity of the insulating material with respect to the stopper material.

Furthermore, the polishing liquid is required to hardly change in properties such as aggregation between the abrasive grains in the case of long-term storage, that is, to be excellent in the storage stability. Among polishing liquids, for example, there is also a multi-pack type polishing liquid capable of being stored while a slurry and an additive liquid are divided, but as compared to a multi-pack type polishing liquid set, a one-pack type polishing liquid is likely to change in properties and it is difficult to enhance the storage stability.

An object of the present invention is to provide a polishing liquid which can improve the polishing selectivity of the insulating material with respect to the stopper material and is also excellent in the storage stability, and a polishing method using this polishing liquid.

Solution to Problem

The present inventor has conducted various studies in order to solve the above problems, and as a result, found that the polishing selectivity of the insulating material with respect to the stopper material can be improved and the storage stability can also be improved by a polishing liquid using a specific copolymer which has a structure unit derived from at least one styrene compound selected from the group consisting of styrene and a styrene derivative and a structure unit derived from acrylic acid and having a pH adjusted in a specific range.

A polishing liquid of an aspect of the present invention is a polishing liquid containing abrasive grains, a copolymer, and a liquid medium, in which the copolymer has a structure unit derived from at least one styrene compound selected from the group consisting of styrene and a styrene derivative and a structure unit derived from acrylic acid, the content of the copolymer is more than 0.01% by mass and 0.2% by mass or less based on the total amount of the polishing liquid, and the pH of the polishing liquid is more than 4.5.

According to this polishing liquid, the polishing selectivity of the insulating material with respect to the stopper material can be improved. Furthermore, the polishing liquid of the present invention hardly changes in properties during storage and is excellent in the storage stability.

Incidentally, in a conventional polishing liquid, although high polishing selectivity of the insulating material with respect to the stopper material is obtainable in evaluation of blanket wafers (unpatterned wafers), in evaluation of pattern wafers (wafers having a pattern; for example, a laminate which has a stopper disposed on the convex portion of a substrate having a concavo-convex pattern and an insulating member disposed on the substrate and the stopper so as to fill the concave portion of the concavo-convex pattern), since the polishing selectivity of the insulating material with respect to the stopper material is high, polishing of the stopper on the convex portion may be suppressed, but the insulating member in the concave portion may be excessively polished, so that a remaining step height called dishing may increase and flatness may deteriorate. On the other hand, according to the polishing liquid of the present invention, in polishing of the insulating member using the stopper, excessive polishing of the stopper on the convex portion and excessive polishing of the insulating member in the concave portion are sufficiently suppressed (the loss amount due to excessive polishing is suppressed), and thus high flatness can be obtained. Furthermore, according to the polishing liquid of the present invention, a base substrate having a concavo-convex pattern can be polished with satisfactory flatness without dependence on the pattern density (for example, without dependence on "a line (L) as a convex portion/a space (S) as a concave portion").

The pH of the polishing liquid is preferably 7.5 or less. The polishing liquid preferably further contains a water-soluble polymer.

The zeta potential of the abrasive grains is preferably negative.

The ratio of the structure unit derived from the styrene compound in the copolymer is preferably 10 mol % or more. The ratio of the structure unit derived from the styrene compound is more preferably 50 mol % or less. The copolymer preferably has a structure unit derived from styrene.

The abrasive grains preferably contain at least one selected from the group consisting of ceria, silica, alumina, zirconia, and yttria.

The polishing liquid preferably further contains a phosphate compound.

The ratio of at least one group selected from the group consisting of a sulfonic acid group and a sulfonate group in the copolymer may be less than 5 mol %.

The content of the copolymer may be more than 6 parts by mass with respect to 100 parts by mass of the abrasive grains.

The polishing liquid is preferably used for polishing a surface to be polished containing silicon oxide.

A polishing method of an aspect of the present invention is a polishing method including a step of polishing a surface to be polished by using the above-described polishing liquid.

A polishing method of another aspect of the present invention is a polishing method for a surface to be polished containing an insulating material and silicon nitride, and includes a step of selectively polishing the insulating material with respect to the silicon nitride by using the above-described polishing liquid.

Advantageous Effects of Invention

According to the present invention, the polishing selectivity of the insulating material with respect to the stopper material can be improved. Furthermore, according to the present invention, in polishing of the insulating member using the stopper, excessive polishing of the stopper on the convex portion and excessive polishing of the insulating member in the concave portion are sufficiently suppressed (the loss amount due to excessive polishing is suppressed), and thus high flatness can be obtained. Furthermore, according to the present invention, the base substrate having a concavo-convex pattern can be polished with satisfactory flatness without dependence on the pattern density (for example, without dependence on L/S).

According to the present invention, in the case of using silicon nitride as the stopper material, the polishing rate for silicon nitride can be sufficiently suppressed. According to the present invention, in polishing of the insulating material by using silicon nitride as the stopper material, when the stopper is exposed, it is possible to suppress that the stopper and the insulating member filled in the concave portion are excessively polished.

According to the present invention, in the CMP technique of flattening an STI insulating film, a pre-metal insulating film, an interlayer insulating film, or the like, these insulating films can also be highly flattened without dependence on the pattern density.

According to the present invention, it is possible to provide use of a polishing liquid in a flattening step of a base substrate surface. According to the present invention, it is possible to provide use of a polishing liquid in a flattening step of STI insulating films, pre-metal insulating films, or interlayer insulating films. According to the present invention, it is possible to provide use of a polishing liquid in a polishing step of selectively polishing an insulating material with respect to a stopper material.

According to the present invention, it is also possible to provide a polishing liquid excellent in the storage stability.

BRIEF DESCRIPTION OF DRAWINGS

FIG. 1 is a schematic cross-sectional view illustrating a pattern wafer used in Examples.

DESCRIPTION OF EMBODIMENTS

Hereinafter, an embodiment of the present invention will be described in detail.

Definition

In the present specification, the term "polishing liquid" is defined as a composition to be brought into contact with a surface to be polished, at the time of polishing. The term "polishing liquid" itself does not limit any components contained in the polishing liquid. As described later, the polishing liquid of the present embodiment contains abrasive grains. The abrasive grains are also referred to as "abrasive particles," but are referred to as "abrasive grains" in the present specification. The abrasive grains are generally solid particles, and it is considered that an object to be removed is removed by the mechanical action of the abrasive grains and the chemical action of the abrasive grains (mainly, the surface of the abrasive grains) at the time of polishing, but the polishing mechanism is not limited thereto.

In the present specification, the term "step" includes not only an independent step but also a step by which an intended action of the step is achieved, even though the step cannot be clearly distinguished from other steps. A numerical range that has been indicated by use of "to" indicates the range that includes the numerical values which are described before and after "to", as the minimum value and the maximum value, respectively. In the numerical ranges that are described stepwise in the present specification, the upper limit value or the lower limit value of the numerical range of a certain stage can be arbitrarily combined with the upper limit value or the lower limit value of the numerical range of another stage. In the numerical ranges that are described in the present specification, the upper limit value or the lower limit value of the numerical value range may be replaced with the value shown in the examples. Materials listed as examples in the present specification may be used singly or in combinations of two or more, unless otherwise specifically indicated. When a plurality of substances corresponding to each component exist in the composition, the content of each component in the composition means the total amount of the plurality of substances that exist in the composition, unless otherwise specified. "Polishing Rate" means a rate at which a material is removed per unit time (Removal Rate). "A or B" may include either one of A and B, and may also include both of A and B. "A or more" in the numerical range means A and a range of more than A. "A or less" in the numerical range means A and a range of less than A.

Polishing Liquid

The polishing liquid of the present embodiment contains abrasive grains, an additive, and a liquid medium. The term "additive" refers to a substance contained in the polishing liquid in addition to the abrasive grains and the liquid medium, for adjusting polishing characteristics such as polishing rate and polishing selectivity; polishing liquid characteristics such as dispersibility of the abrasive grains, and the like, or for improving the storage stability of the polishing liquid. The polishing liquid of the present embodiment can be used as a polishing liquid for CMP. Hereinafter, essential components and optional components of the polishing liquid will be described.

The abrasive grains preferably contain at least one selected from the group consisting of ceria (cerium oxide), silica (silicon oxide), alumina, zirconia, and yttria and more preferably contain ceria, from the viewpoint of easily obtaining a desired polishing rate for the insulating material. The abrasive grains may be used singly or in combination of two or more kinds thereof. The abrasive grains may be composite particles in which other particles adhere to the surface of one particle. The abrasive grains may not have a sulfur atom on the surfaces of particles.

Ceria can be obtained by oxidizing cerium salts such as cerium carbonate, cerium oxycarbonate, cerium nitrate, cerium sulfate, cerium oxalate, and cerium hydroxide. Examples of the oxidation method include a firing method in which a cerium salt is fired at about 600 to 900° C. and a chemical oxidation method in which a cerium salt is oxidized using an oxidizing agent such as hydrogen peroxide. As the ceria, from the viewpoint of further improving the polishing selectivity of the insulating material with respect to the stopper material and flatness, at least one selected from the group consisting of cerium carbonate-derived ceria is preferred.

The lower limit of the average particle diameter of the abrasive grains is preferably 50 nm or more, more preferably 100 nm or more, and even more preferably 120 nm or more, from the viewpoint of further improving the polishing rate for the insulating material. The upper limit of the average particle diameter of the abrasive grains is preferably 300 nm or less, more preferably 250 nm or less, even more preferably 200 nm or less, particularly preferably 180 nm or less, and extremely preferably 150 nm or less, from the viewpoint of suppressing scratches at the polished surface. From these viewpoints, the average particle diameter of the abrasive grains is more preferably 50 to 300 nm.

The "average particle diameter" of the abrasive grains is an average particle diameter (D50) of the abrasive grains in the polishing liquid and means an average secondary particle diameter of the abrasive grains. The average particle diameter of the abrasive grains can be measured, for example, for the polishing liquid, for example, using a laser diffraction scattering type particle size distribution measuring apparatus (trade name: Microtrac MT3300EXII manufactured by MicrotracBEL Corp.).

The zeta potential of the abrasive grains in the polishing liquid is preferably in the following range. The zeta potential of the abrasive grains is preferably negative (less than 0 mV) from the viewpoint of improving flatness. That is, the polishing liquid of the present embodiment preferably contains anionic abrasive grains. By using the abrasive grains having a negative zeta potential, it is easy to suppress aggregation between the abrasive grains and an anionic polymer (for example, a polymer having a carboxyl group derived from acrylic acid). The upper limit of the zeta potential of the abrasive grains is more preferably −5 mV or less, even more preferably −10 mV or less, particularly preferably −20 mV or less, extremely preferably −30 mV or less, highly preferably −40 mV or less, and still even more preferably −50 mV or less, from the viewpoint of improving flatness and the viewpoint of further enhancing the storage stability of the polishing liquid. The lower limit of the zeta potential of the abrasive grains is preferably −80 mV or more, more preferably −70 mV or more, and even more preferably −65 mV or more, from the viewpoint of easily obtaining a desired polishing rate for the insulating material. From these viewpoints, the zeta potential of the abrasive grains is more preferably −80 mV or more and less than 0 mV.

The zeta potential ($\zeta$ [mV]) can be measured using a zeta potential measuring device (for example, DelsaNano C (device name) manufactured by Beckman Coulter, Inc.). The zeta potential of the abrasive grains in the polishing liquid can be obtained, for example, by putting the polishing liquid in a dense cell unit (cell for a high-concentration sample) for the zeta potential measuring device and then measuring.

The content of the abrasive grains is preferably in the following range based on the total amount of the polishing liquid. The lower limit of the content of the abrasive grains is preferably 0.05% by mass or more, more preferably 0.1% by mass or more, even more preferably 0.15% by mass or more, particularly preferably 0.2% by mass or more, and extremely preferably 0.25% by mass or more, from the viewpoint of further improving the polishing rate for the insulating material. The upper limit of the content of the abrasive grains is preferably 20% by mass or less, more preferably 15% by mass or less, even more preferably 10% by mass or less, particularly preferably 5.0% by mass or less, extremely preferably 3.0% by mass or less, and highly preferably 1.0% by mass or less, from the viewpoint of further enhancing the storage stability of the polishing liquid. From these viewpoints, the content of the abrasive grains is more preferably 0.05 to 20% by mass.

(Additive)
[Copolymer]

The polishing liquid of the present embodiment contains, as an additive, a copolymer (hereinafter, referred to as "copolymer P") having a structure unit derived from at least one styrene compound selected from the group consisting of styrene and a styrene derivative (hereinafter, referred to as "first structure unit" in some cases) and a structure unit derived from acrylic acid (hereinafter, referred to as "second structure unit" in some cases).

The copolymer P has an effect (an effect as a polishing inhibitor) of suppressing an excessive increase in polishing rate for the stopper material (such as silicon nitride). Furthermore, by using the copolymer P, excessive polishing of the insulating member (such as a silicon oxide film) after the stopper is exposed is suppressed and high flatness can be obtained.

The detailed reason why such an effect is exhibited is not necessarily clear, but the present inventor speculates an example of the reason in the following way. That is, the carboxyl group derived from acrylic acid in the copolymer P acts on a hydrophilic insulating member by hydrogen bonding so that the copolymer P is adsorbed to the insulating member to cover the insulating member. Furthermore, the styrene compound-derived benzene ring in the copolymer P acts on a hydrophobic stopper (for example, relatively hydrophobic silicon nitride having hydrophilicity weaker than that of the insulating material (such as silicon oxide)) by a hydrophobic interaction so that the copolymer P is adsorbed to the stopper to cover the stopper. Furthermore, the copolymer P obtained by using these monomers has higher solubility than that of a polymer not using these monomers (for example, a polymer using methacrylic acid instead of acrylic acid) and the aforementioned action is suitably obtainable. According to these, it is speculated that progress of polishing by the abrasive grains is alleviated and the polishing rate for the stopper material can be sufficiently suppressed.

The copolymer P preferably has a structure unit derived from styrene from the viewpoint of further improving the polishing selectivity of the insulating material with respect to the stopper material and the viewpoint of improving flatness.

The degree of solubility of the styrene compound with respect to water at 25° C. is preferably in the following range. The upper limit of the degree of solubility of the styrene compound is preferably 0.1 g/100 ml or less, more preferably 0.05 g/100 ml or less, even more preferably 0.03 g/100 ml or less, from the viewpoint of easily exerting the aforementioned hydrophobic interaction sufficiently and further improving the polishing selectivity of the insulating material with respect to the stopper material and the viewpoint of improving flatness. The lower limit of the degree of solubility of the styrene compound is preferably 0.01 g/100 ml or more, more preferably 0.02 g/100 ml or more, and even more preferably 0.025 g/100 ml or more, from the viewpoint of easily maintaining the solubility of the whole copolymer P and further improving the polishing selectivity of the insulating material with respect to the stopper material and the viewpoint of improving flatness. The degree of solubility of styrene with respect to water at 25° C. is 0.03 g/100 ml.

Examples of the styrene derivative include alkyl styrene (such as α-methylstyrene), alkoxy styrene (such as α-methoxystyrene or p-methoxystyrene), m-chlorostyrene, 4-carboxystyrene, and styrenesulfonic acid. As the styrene derivative, a styrene derivative not having a hydrophilic group can be used. Examples of the hydrophilic group include a polyether group, a hydroxyl group, a carboxyl group, a sulfonic acid group, and an amino group. The copolymer P may have a structure unit derived from other monomer which is polymerizable with the styrene compound or acrylic acid. Examples of such a monomer include methacrylic acid.

The copolymer P may be used singly or in combination of two or more kinds thereof for adjusting polishing characteristics such as polishing selectivity or flatness, and the like. As the two or more kinds of the copolymer P, copolymers having different ratios of structure units derived from the styrene compound can be used in combination.

The ratio of the first structure unit derived from the styrene compound in the copolymer P is preferably in the following range based on the total amount of the structure unit of the copolymer P. The upper limit of the ratio of the first structure unit is preferably 50 mol % or less, more preferably 45 mol % or less, even more preferably 40 mol % or less, and particularly preferably 35 mol % or less, from the viewpoint of having excellent solubility of the copolymer P and easily improving the polishing selectivity of the insulating material with respect to the stopper material and flatness. The lower limit of the ratio of the first structure unit is preferably 10 mol % or more, more preferably 15 mol % or more, even more preferably 20 mol % or more, particularly preferably 25 mol % or more, and extremely preferably 30 mol % or more, from the viewpoint of further improving the polishing selectivity of the insulating material with respect to the stopper material and the viewpoint of improving flatness. From these viewpoints, the ratio of the first structure unit is preferably 10 to 50 mol %, 10 to 45 mol %, 10 to 40 mol %, 10 to 35 mol %, 15 to 50 mol %, 15 to 45 mol %, 15 to 40 mol %, 15 to 35 mol %, 20 to 50 mol %, 20 to 45 mol %, 20 to 40 mol %, 20 to 35 mol %, 25 to 50 mol %, 25 to 45 mol %, 25 to 40 mol %, 25 to 35 mol %, 30 to 50 mol %, 30 to 45 mol %, 30 to 40 mol %, or 30 to 35 mol %.

The ratio of the second structure unit in the copolymer P is preferably in the following range based on the total amount of the structure unit of the copolymer P. The upper limit of the ratio of the second structure unit is preferably 90 mol % or less, more preferably 85 mol % or less, even more preferably 80 mol % or less, particularly preferably 75 mol % or less, and extremely preferably 70 mol % or less, from the viewpoint of further improving the polishing selectivity and the viewpoint of improving flatness. The lower limit of the ratio of the second structure unit is preferably 50 mol % or more, more preferably 55 mol % or more, even more preferably 60 mol % or more, and particularly preferably 65 mol % or more, from the viewpoint of having excellent solubility of the copolymer P and easily improving the polishing selectivity of the insulating material with respect to the stopper material. From these viewpoints, the ratio of the second structure unit is more preferably 50 to 90 mol %, 50 to 85 mol %, 50 to 80 mol %, 50 to 75 mol %, 50 to 70 mol %, 55 to 90 mol %, 55 to 85 mol %, 55 to 80 mol %, 55 to 75 mol %, 55 to 70 mol %, 60 to 90 mol %, 60 to 85 mol %, 60 to 80 mol %, 60 to 75 mol %, 60 to 70 mol %, 65 to 90 mol %, 65 to 85 mol %, 65 to 80 mol %, 65 to 75 mol %, or 65 to 70 mol %.

The ratio of at least one group selected from the group consisting of a sulfonic acid group and a sulfonate group in the copolymer P may be less than 5 mol % and may be 3 mol % or less or 1 mol % or less, based on the total amount of the copolymer P. The copolymer P may not have at least one group selected from the group consisting of a sulfonic acid group and a sulfonate group.

The upper limit of the weight average molecular weight Mw of the copolymer P is preferably 20000 or less, more preferably less than 20000, even more preferably 19000 or less, particularly preferably 18000 or less, extremely preferably 17000 or less, and highly preferably 16000 or less, from the viewpoint of easily obtaining suitable polishing selectivity and a desired polishing rate for the insulating material. The lower limit of the weight average molecular weight Mw of the copolymer P is preferably 1000 or more, more preferably 3000 or more, even more preferably 5000 or more, and particularly preferably 6000 or more, from the viewpoint of further improving the polishing selectivity of the insulating material with respect to the stopper material and the viewpoint of improving flatness. The lower limit of the weight average molecular weight Mw of the copolymer P may be 8000 or more, 10000 or more, or 12000 or more. From these viewpoints, the weight average molecular weight Mw of the copolymer P is more preferably 1000 to 20000. The weight average molecular weight is a value measured by gel permeation chromatography (GPC) and converted in terms of polyethylene glycol/polyethylene oxide.

Specifically, the weight average molecular weight can be measured by the following method.

[Measuring Method]

Equipment used (detector): "RID-10A" differential refractometer for liquid chromatograph manufactured by SHIMADZU CORPORATION Pump: "RID-10A" manufactured by SHIMADZU CORPORATION Degassing apparatus: "DGU-20$A_{3R}$" manufactured by SHIMADZU CORPORATION Data processing: "LC solution" manufactured by SHIMADZU CORPORATION Column: "Gelpak GL-W530+Gelpak GL-W540" manufactured by Hitachi Chemical Techno Service Co., LTD., inner diameter 10.7 mm×300 mm Eluent: 50 mM-$Na_2HPO_4$ aqueous solution/acetonitrile=90/10 (v/v)

Measurement temperature: 40° C.

Flow rate: 1.0 ml/min

Measurement time: 60 minutes

Sample: Sample prepared by adjusting a concentration with a solution having the same composition as the eluent so that the resin concentration becomes 0.2% by mass and filtering through a 0.45 μm membrane filter Injection amount: 100 μl Standard substance: Polyethylene glycol/polyethylene oxide manufactured by Tosoh Corporation The content of the copolymer P is more than 0.01% by mass and 0.2% by mass or less based on the total amount of the polishing liquid and is preferably in the following range. The lower limit of the content of the copolymer P is preferably 0.02% by mass or more and more preferably 0.03% by mass or more, from the viewpoint of further improving the polishing selectivity of the insulating material with respect to the stopper material and the viewpoint of improving flatness. The upper limit of the content of the copolymer P is preferably 0.15% by mass or less, more preferably 0.13% by mass or less, even more preferably 0.1% by mass or less, particularly preferably 0.07% by mass or less, and extremely preferably 0.05% by mass or less, from the viewpoint of further improving the storage stability and easily obtaining a desired polishing rate for the insulating material. From these viewpoints, the content of the copolymer P is preferably more than 0.01% by mass and 0.15% by mass or less, more than 0.01% by mass and 0.13% by mass or less, more than 0.01% by mass and 0.1% by mass or less, more than 0.01% by mass and 0.07% by mass or less, more than 0.01% by mass and 0.05% by mass or less, 0.02 to 0.2% by mass, 0.02 to 0.15% by mass, 0.02 to 0.13% by mass, 0.02 to 0.1% by mass, 0.02 to 0.07% by mass, 0.02 to 0.05% by mass, 0.03 to 0.2% by mass, 0.03 to 0.15% by mass, 0.03 to 0.13% by mass, 0.03 to 0.1% by mass, 0.03 to 0.07% by mass, or 0.03 to 0.05% by mass. In the case of using a plurality of copolymers as the copolymer P, the total content of the respective copolymers preferably satisfies the above range.

The content of the copolymer P may be more than 6 parts by mass and may be 8 parts by mass or more, 10 parts by mass or more, 12 parts by mass or more, or 15 parts by mass or more, with respect to 100 parts by mass of the abrasive grains. The content of the copolymer P may be 50 parts by mass or less, 40 parts by mass or less, 30 parts by mass or less, 25 parts by mass or less, 20 parts by mass or less, or 18 parts by mass or less, with respect to 100 parts by mass of the abrasive grains.

[Water-Soluble Polymer]

The polishing liquid of the present embodiment preferably contains a water-soluble polymer other than the aforementioned copolymer P as an additive, from the viewpoint of further improving the polishing selectivity of the insulating material with respect to the stopper material and the viewpoint of easily obtaining a desired polishing rate for the insulating material. The "water-soluble polymer" is defined as a polymer which is dissolved in 100 g of water in an amount of 0.1 g or more. Examples of the water-soluble polymer include polysaccharides such as polyglycerol, alginic acid, pectic acid, carboxymethyl cellulose, agar, curdlan, and pullulan; a homopolymer of unsaturated carboxylic acid such as acrylic acid, methacrylic acid, maleic acid, fumaric acid, or itaconic acid (such as polyacrylic acid); an ammonium salt or amine salt of this polymer; a copolymer of an unsaturated carboxylic acid such as acrylic acid, methacrylic acid, maleic acid, fumaric acid, or itaconic acid and a monomer such as alkyl acrylate (such as methyl acrylate or ethyl acrylate), hydroxyalkyl acrylate (such as hydroxyethyl acrylate), alkyl methacrylate (such as methyl methacrylate or ethyl methacrylate), hydroxyalkyl methacrylate (such as hydroxyethyl methacrylate), vinyl acetate, or vinyl alcohol (such as a copolymer of acrylic acid or alkyl acrylate); and an ammonium salt or amine salt of this copolymer. As the water-soluble polymer, non-ionic polymers are preferred and polysaccharides are preferred.

The content of the water-soluble polymer is preferably in the following range based on the total amount of the polishing liquid. The lower limit of the content of the water-soluble polymer is preferably 0.01% by mass or more, more preferably 0.05% by mass or more, and even more preferably 0.07% by mass or more, from the viewpoint of further improving the polishing selectivity of the insulating material with respect to the stopper material and the viewpoint of easily obtaining a desired polishing rate for the insulating material. The upper limit of the content of the water-soluble polymer is preferably 1.0% by mass or less, more preferably 0.5% by mass or less, and even more preferably 0.3% by mass or less.

[Phosphate Compound or Hydrogen Phosphate Compound]

The polishing liquid of the present embodiment can contain a phosphate compound or a hydrogen phosphate compound as necessary. The phosphate compound or the hydrogen phosphate compound can have a role as a dispersant (a dispersant of the abrasive grains). The phosphate compound or the hydrogen phosphate compound may be used in adjustment of pH.

As the phosphate compound, at least one selected from the group consisting of a phosphate and a derivative thereof (a phosphate derivative) can be used. As the hydrogen phosphate compound, at least one selected from the group consisting of a hydrogen phosphate and a derivative thereof (a hydrogen phosphate derivative) can be used.

Examples of the phosphate include potassium phosphate, sodium phosphate, ammonium phosphate, and calcium phosphate, and specific examples thereof include tripotassium phosphate, trisodium phosphate, ammonium phosphate, and tricalcium phosphate. Examples of the phosphate derivative include sodium diphosphate, potassium diphosphate, potassium polyphosphate, ammonium polyphosphate, and calcium polyphosphate.

Examples of the hydrogen phosphate include potassium hydrogen phosphate, sodium hydrogen phosphate, ammonium hydrogen phosphate, and calcium hydrogen phosphate, and specific examples thereof include dipotassium hydrogen phosphate, disodium hydrogen phosphate, diammonium hydrogen phosphate, calcium hydrogen phosphate, potassium dihydrogen phosphate, sodium dihydrogen phosphate, ammonium dihydrogen phosphate, and calcium dihydrogen phosphate. Examples of the hydrogen phosphate derivative include potassium tetradodecyl hydrogen phosphate, sodium dodecyl hydrogen phosphate, and dodecylammonium hydrogen phosphate.

The polishing liquid of the present embodiment preferably contains at least one selected from the group consisting of a hydrogen phosphate (such as ammonium dihydrogen phosphate) and a phosphate from the viewpoint of easily obtaining a desired polishing rate for the insulating material.

The content of the phosphate compound or the hydrogen phosphate compound is preferably in the following range based on the total amount of the polishing liquid. The lower limit of the content of the phosphate compound or the hydrogen phosphate compound is preferably 0.0005% by mass or more, more preferably 0.001% by mass or more, even more preferably 0.002% by mass or more, particularly preferably 0.003% by mass or more, highly preferably 0.004% by mass or more, and extremely preferably 0.005% by mass or more, from the viewpoint of easily dispersing the abrasive grains suitably. The upper limit of the content of the phosphate compound or the hydrogen phosphate compound is preferably 0.05% by mass or less, more preferably 0.04% by mass or less, even more preferably 0.03% by mass or less, particularly preferably 0.02% by mass or less, and extremely preferably 0.01% by mass or less, from the viewpoint of easily preventing the aggregation of the abrasive grains dispersed once. From these viewpoints, the content of the phosphate compound or the hydrogen phosphate compound is more preferably 0.0005 to 0.05% by mass.

[pH Adjusting Agent]

The polishing liquid of the present embodiment can contain a pH adjusting agent (excluding a compound corresponding to the copolymer P). The pH can be adjusted to a desired pH by the pH adjusting agent.

The pH adjusting agent is not particularly limited, and examples thereof include an organic acid, an inorganic acid, an organic base, and an inorganic base. Examples of the organic acid include formic acid, acetic acid, propionic acid, butyric acid, valeric acid, caproic acid, lactic acid, maleic acid, phthalic acid, citric acid, and succinic acid. Examples of the inorganic acid include nitric acid, sulfuric acid, hydrochloric acid, phosphoric acid, and boric acid. Examples of the organic base include triethylamine, pyridine, piperidine, pyrrolidine, imidazole, 2-methylimidazole, and chitosan. Examples of the inorganic base include tetramethylammonium hydroxide (TMAH), ammonia, potassium hydroxide, and sodium hydroxide. The pH adjusting agent may be used singly or in combination of two or more kinds thereof.

[Other Additives]

The polishing liquid of the present embodiment can contain additives other than the copolymer P, the water-soluble polymer, the phosphate compound or the hydrogen phosphate compound, and the pH adjusting agent. Examples of such additives include a buffering agent for stabilizing pH. The buffering agent may be added as a buffer solution (a solution containing a buffering agent). Examples of such a buffer solution include an acetate buffer solution and a phthalate buffer solution. The buffering agent may be used singly or in combination of two or more kinds thereof.

(Liquid Medium)

The liquid medium in the polishing liquid of the present embodiment is not particularly limited, but is preferably water such as deionized water or ultrapure water. The content of the liquid medium may correspond to the remaining of the polishing liquid from which the contents of other constituent components are removed, and is not particularly limited.

(pH)

The polishing liquid of the present embodiment is more than 4.5. Thereby, aggregation of a component contained in the polishing liquid can be suppressed, and the storage stability of the polishing liquid can be improved. The pH of the polishing liquid is preferably in the following range. The lower limit of the pH of the polishing liquid is preferably 4.9 or more, more preferably 5.2 or more, and even more preferably 5.5 or more, from the viewpoint of maintaining the storage stability of the polishing liquid and improving the polishing rate for the insulating material. The upper limit of the pH of the polishing liquid of the present embodiment is preferably 7.5 or less, more preferably 7.2 or less, even more preferably 7.0 or less, and particularly preferably 6.5 or less, from the viewpoint of easily improving flatness. From these viewpoints, the pH of the polishing liquid of the present embodiment is preferably more than 4.5 and 7.5 or less, more than 4.5 and 7.2 or less, more than 4.5 and 7.0 or less, more than 4.5 and 6.5 or less, 4.9 to 7.5, 4.9 to 7.2, 4.9 to 7.0, 4.9 to 6.5, 5.2 to 7.5, 5.2 to 7.2, 5.2 to 7.0, or 5.2 to 6.5. The pH of the polishing liquid is a pH of the polishing liquid at 25° C.

The pH of the polishing liquid of the present embodiment can be measured by a pH meter (for example, Model No. D-51 manufactured by HORIBA, Ltd.). Specifically, for example, after performing 3-point calibration of the pH meter using a phthalate pH buffer solution (pH: 4.01), a neutral phosphate pH buffer solution (pH: 6.86), and a borate pH buffer solution (pH: 9.18) as standard buffer solutions, an electrode of the pH meter is placed in the polishing liquid, and the pH upon stabilization after an elapse of 2 minutes or longer is measured. At this time, both the liquid temperatures of the standard buffer solutions and the polishing liquid are set to 25° C.

(Others)

The polishing liquid of the present embodiment is suitably used as one-pack type polishing liquid containing the aforementioned components. This polishing liquid may be stored as a stock solution for a polishing liquid, in which the content of the liquid medium has been reduced, and may be used after being diluted with the liquid medium immediately before polishing or during polishing.

Polishing Method

The polishing method of the present embodiment may include a polishing step of polishing a surface to be polished by using the polishing liquid. The polishing method of the present embodiment is, for example, a polishing method for a base substrate having a surface to be polished.

The polishing method of the present embodiment may be a polishing method for a base substrate having a surface to be polished containing an insulating material (such as silicon oxide) and a stopper material (such as silicon nitride). The base substrate may have, for example, an insulating member containing an insulating material and a stopper containing a stopper material. The polishing liquid of the present embodiment is preferably used for polishing a surface to be polished containing silicon oxide.

The polishing step may be a step of selectively polishing the insulating material with respect to the stopper material using the polishing liquid. The polishing method of the present embodiment may be a polishing method for a surface to be polished containing the insulating material and silicon nitride, and may include a step of selectively polishing the insulating material with respect to the silicon nitride by using the polishing liquid. The expression "selectively polishing a material A with respect to a material B" means that a polishing rate for the material A is higher than a polishing rate for the material B in the same polishing conditions. More specifically, for example, it means that the material A is polished at a polishing rate ratio of the polishing rate for the material A with respect to the polishing rate for the material B of preferably 15 or more (more preferably 20 or more).

In the polishing step, for example, while a surface to be polished of a base substrate having the surface to be polished is pressed on a polishing pad (polishing cloth) of a polishing platen, the polishing liquid is supplied between the surface to be polished and the polishing pad, and the base substrate and the polishing platen are relatively moved to polish the surface to be polished. In the polishing step, for example, at least a part of a material to be polished is removed by polishing.

As the base substrate which is an object to be polished, for example, a base substrate in which a material to be polished is formed on a substrate for semiconductor element production (for example, a semiconductor substrate in which an STI pattern, a gate pattern, a wiring pattern, or the like is formed) is exemplified. Examples of the material to be polished include an insulating material such as silicon oxide; and a stopper material such as silicon nitride. The material to be polished may be a single material or a plurality of materials. In the case in which the plurality of materials is exposed to the surface to be polished, these can be regarded as the materials to be polished. The material to be polished may be in the form of a film (film to be polished). The shape of the insulating member is not particularly limited, and for example, is a film shape (an insulating film). The shape of the stopper is not particularly limited, and for example, is a film shape (a stopper film: a silicon nitride film or the like).

By polishing the material to be polished (for example, an insulating film such as a silicon oxide film) formed on the substrate using the polishing liquid of the present embodiment to remove an excess region, irregularities on the surface of the material to be polished are eliminated and thus a flat and smooth surface can be obtained over the entire polished surface.

In the present embodiment, it is possible to polish an insulating member of a base substrate which has a substrate having a concavo-convex pattern, a stopper disposed on the convex portion of the substrate, and the insulating member disposed on the substrate and the stopper so as to fill the concave portion of the concavo-convex pattern (a base substrate which has an insulating member (for example, a silicon oxide film containing silicon oxide on at least a surface), a stopper disposed at the lower layer of the insulating member, and a semiconductor substrate disposed below the stopper). In such a base substrate, since excessive polishing of the insulating member can be prevented by stopping the polishing when the stopper is exposed, the flatness of the insulating member after polishing can be improved. The stopper material constituting the stopper is a material having a polishing rate lower than that for the insulating material, and silicon nitride or the like is preferred.

In the polishing method of the present embodiment, as a polishing apparatus, it is possible to use a common polishing apparatus which has a holder capable of holding a base substrate (semiconductor substrate or the like) having a surface to be polished and a polishing platen to which a polishing pad can be pasted. A motor or the like in which the number of rotations can be changed is attached to each of the holder and the polishing platen. As the polishing apparatus, for example, a polishing apparatus: MIRRA manufactured by Applied Materials, Inc. can be used.

As the polishing pad, common unwoven cloth, a foamed body, an unfoamed body, or the like can be used. As the material of the polishing pad, it is possible to use a resin such as polyurethane, an acrylic resin, polyester, an acrylic-ester copolymer, polytetrafluoroethylene, polypropylene, polyethylene, poly-4-methylpentene, cellulose, cellulose ester, polyamide (for example, Nylon (trade name) and aramid), polyimide, polyimidamide, a polysiloxane copolymer, an oxirane compound, a phenolic resin, polystyrene, polycarbonate, or an epoxy resin. As the material of the polishing pad, particularly, foamed polyurethane and unfoamed polyurethane are preferable from the viewpoint of being further excellent in polishing rate for the insulating material and flatness. It is preferable that the polishing pad is subjected to grooving so that the polishing liquid is pooled.

Polishing conditions are not particularly limited, but the rotation speed of the polishing platen is preferably 200 rpm (=rotations/min) or less such that the base substrate is not let out, and the polishing pressure to be applied to the base substrate (processing load) is preferably 100 kPa or less from the viewpoint of sufficiently suppressing the generation of polishing scratches. The polishing liquid is preferably continuously supplied to the polishing pad with a pump or the like during polishing. The amount supplied for this is not particularly limited, but it is preferable that the surface of the polishing pad is always covered with the polishing liquid.

The base substrate after the completion of polishing is preferably thoroughly washed in flowing water to remove the particles adhering to the base substrate. For the washing, dilute hydrofluoric acid or ammonia water may be used in addition to pure water, and a brush may be used to increase the washing efficiency. Furthermore, it is preferable that, after washing, the water droplets adhering to the base substrate are removed off using a spin dryer or the like, and then the base substrate is dried.

The polishing liquid and the polishing method of the present embodiment can be suitably used in formation of an STI. For the formation of the STI, the polishing rate ratio of the insulating material (silicon oxide or the like) with respect to the stopper material (silicon nitride or the like) is preferably 15 or more, and more preferably 20 or more. When the polishing rate ratio is less than 15, the magnitude of the polishing rate for the insulating material with respect to the polishing rate for the stopper material is small, and thus, it tends to be difficult to stop polishing at a predetermined position during formation of the STI. On the other hand, when the polishing rate ratio is 15 or more, it becomes easier to stop polishing, and thus, it is suitable for STI formation.

The polishing liquid and the polishing method of the present embodiment can also be used in polishing of a pre-metal insulating film. As the pre-metal insulating film, in addition to silicon oxide, for example, phosphorus-silicate glass, boron-phosphorus-silicate glass, silicon oxyfluoride, fluorinated amorphous carbon, and or like can be used.

The polishing liquid and the polishing method of the present embodiment can also be applied to materials other than the insulating material such as silicon oxide. Examples of such a material include high permittivity materials such as Hf-based, Ti-based, or Ta-based oxides; semiconductor materials such as silicon, amorphous silicon, SiC, SiGe, Ge, GaN, GaP, GaAs, or organic semiconductors; phase-change materials such as GeSbTe; inorganic conductive materials such as ITO; and polymer resin materials such as polyimide-based, polybenzooxazole-based, acrylic, epoxy-based, or phenol-based materials.

The polishing liquid and the polishing method of the present embodiment can also be applied not only to film-like objects to be polished, but also to various types of substrates made of glass, silicon, SiC, SiGe, Ge, GaN, GaP, GaAs, sapphire, plastics, or the like.

The polishing liquid and the polishing method of the present embodiment can be used not only for production of semiconductor elements, but also for production of image display devices such as TFTs or organic ELs; optical parts such as photomasks, lenses, prisms, optical fibers, or single crystal scintillators; optical elements such as optical switching elements or optical waveguides; light-emitting elements such as solid lasers or blue laser LEDs; and magnetic storage devices such as magnetic disks or magnetic heads.

EXAMPLES

Preparation of Polishing Liquid for CMP

Example 1

12 g of a stock solution for a slurry containing 5% by mass of ceria particles [cerium carbonate-derived particles; ceria particles obtained by oxidizing cerium carbonate], 0.05% by mass of ammonium dihydrogen phosphate, and 94.95% by mass of water and 88 g of a stock solution for an additive containing 0.3% by mass of styrene/acrylic acid copolymer (copolymer P) [ST/AA, styrene ratio: 10 mol %, Mw: 6700] and 99.7% by mass of water were mixed, and then 10% by mass of phosphoric acid aqueous solution was added so that the pH of the polishing liquid was adjusted to 5.5. Then, water was added so that the total amount became 600 g, thereby a polishing liquid for CMP (600 g) containing 0.3% by mass of ceria particles, 0.05% by mass of styrene/acrylic acid copolymer, and 0.005% by mass of ammonium dihydrogen phosphate as a dispersant was prepared.

Example 2

A polishing liquid for CMP was prepared in the same manner as in Example 1, except that a styrene/acrylic acid copolymer [styrene ratio: 30 mol %, Mw: 6000] was used as the copolymer P.

Example 3

A polishing liquid for CMP was prepared in the same manner as in Example 2, except that polyglycerol that is a water-soluble polymer was used as the additive and was added in 0.1% by mass based on the total amount of the polishing liquid.

Example 4

A polishing liquid for CMP was prepared in the same manner as in Example 1, except that a styrene/acrylic acid copolymer [styrene ratio: 50 mol %, Mw: 3500] was used as the copolymer P.

Example 5

A polishing liquid for CMP was prepared in the same manner as in Example 3, except that the content of the copolymer P was changed to 0.03% by mass based on the total amount of the polishing liquid.

Example 6

A polishing liquid for CMP was prepared in the same manner as in Example 3, except that 10% by mass of phosphoric acid aqueous solution was added so that the pH of the polishing liquid was adjusted to 6.5.

Example 7

A polishing liquid for CMP was prepared in the same manner as in Example 3, except that 10% by mass of phosphoric acid aqueous solution was added so that the pH of the polishing liquid was adjusted to 7.5.

Example 8

A polishing liquid for CMP was prepared in the same manner as in Example 3, except that 9.9% by mass of ammonium dihydrogen phosphate aqueous solution was added so that the pH of the polishing liquid was adjusted to 6.1.

Example 9

A polishing liquid for CMP was prepared in the same manner as in Example 3, except that the content of the copolymer P was changed to 0.03% by mass based on the total amount of the polishing liquid and 9.9% by mass of ammonium dihydrogen phosphate aqueous solution was added so that the pH of the polishing liquid was adjusted to 7.2.

Comparative Example 1

A polishing liquid for CMP was prepared in the same manner as in Example 3, except that 10% by mass of phosphoric acid aqueous solution was added so that the pH of the polishing liquid was adjusted to 4.5.

Comparative Example 2

A polishing liquid for CMP was prepared in the same manner as in Example 3, except that the content of the copolymer P was changed to 0.3% by mass based on the total amount of the polishing liquid and 10% by mass of phosphoric acid aqueous solution was added so that the pH of the polishing liquid was adjusted to 5.7.

Comparative Example 3

A polishing liquid for CMP was prepared in the same manner as in Comparative Example 2, except that the content of the copolymer P was changed to 0.01% by mass based on the total amount of the polishing liquid.

Comparative Example 4

A polishing liquid for CMP was prepared in the same manner as in Example 3, except that the copolymer P of Example 3 was changed to polyacrylic acid [PAA, styrene ratio: 0 mol %, Mw: 2000].

<Evaluation of Polishing Liquid Characteristics>

The pH of the polishing liquid for CMP obtained above, the average particle diameter of the abrasive grains in the polishing liquid for CMP, and the zeta potential (surface potential) of the abrasive grains were evaluated as follows.

(pH)

Measurement temperature: 25±5° C.

Measurement apparatus: Model No. D-51 manufactured by HORIBA, Ltd.

Measurement method: After performing 3-point calibration using a standard buffer solution (phthalate pH buffer solution, pH: 4.01 (25° C.); neutral phosphate pH buffer solution, pH: 6.86 (25° C.); borate pH buffer solution, pH: 9.18 (25° C.)), an electrode was placed in the polishing liquid for CMP, and the pH upon stabilization after an elapse of 2 minutes or longer was measured by the measurement apparatus.

(Average Particle Diameter of Abrasive Grains)

An appropriate amount of the polishing liquid for CMP was introduced into Microtrac MT3300EXII (trade name) manufactured by MicrotracBEL Corp., and the average particle diameter of the abrasive grains was measured. The displayed average particle diameter value was obtained as the average particle diameter (average secondary particle diameter, D50). The average particle diameter was 150 nm.

(Zeta Potential of Abrasive Grains)

An appropriate amount of the polishing liquid for CMP was introduced and set into a dense cell unit of DelsaNano C (device name) manufactured by Beckman Coulter, Inc. The measurement was performed at 25° C. twice, and the average value of the displayed zeta potential was obtained as the zeta potential.

Evaluation of Storage Stability of Polishing Liquid

The storage stability of the obtained polishing liquid was evaluated by the following method. Each of the polishing liquids of Examples and Comparative Examples was left to stand still in a thermostatic bath set at 60° C. for 7 days. The electric conductivity, the pH, and the average particle diameter of the abrasive grains of both of the polishing liquid before still standing and the polishing liquid after still standing were measured. Based on the polishing liquid immediately after preparation, in a case in which the electric conductivity of the polishing liquid after still standing is ±0.2 mS/m, the pH is ±0.5, and the average particle diameter of the abrasive grains is in a range of ±0.01 μm, the storage stability was evaluated as A, and a case in which at least one of the measurement items is not in the above ranges was evaluated as B. When the result of the evaluation is A, it can be said that the storage stability is excellent. Incidentally, the electric conductivity was measured by using the above-described pH meter, and the pH and the average particle diameter of the abrasive grains were measured by the same methods as the aforementioned methods.

CMP Evaluation

The substrate to be polished was polished using the polishing liquid for CMP under the following polishing conditions. In the evaluation with respect to the pattern wafer, the polishing liquids for CMP of Examples 2, 3, 5, and 8 and Comparative Example 3 were used.

(CMP Polishing Conditions)

Polishing apparatus: MIRRA (manufactured by Applied Materials, Inc.)

Flow rate of polishing liquid for CMP: 200 ml/min

Substrate to be polished: Blanket wafer and pattern wafer described below

Polishing pad: Foamed polyurethane resin having closed pores (manufactured by Rohm and Haas Japan K.K., Product No.: IC1010)

Polishing pressure: 3.0 psi

Number of rotations of substrate and polishing platen: Substrate/polishing platen=93/87 rpm Polishing time: Polishing was performed for 1 minute.

Drying of wafer: After a CMP treatment, drying was performed by a spin dryer.

[Blanket Wafer]

As a blanket wafer (BTW) with no patterns formed, a base substrate having a silicon oxide film with a thickness of 1 μm formed on a silicon substrate by a plasma CVD method, a base substrate having a silicon nitride film with a thickness of 0.2 μm formed on a silicon substrate by a CVD method, and a base substrate having a polysilicon film with a thickness of 0.15 μm formed on a silicon substrate by a CVD method were used.

[Pattern Wafer]

As a pattern wafer (PTW) with a simulated pattern formed, 864 wafer (trade name, diameter: 200 mm) manufactured by SEMATECH was used. This pattern wafer was a wafer obtained by stacking a silicon nitride film as a stopper on a silicon substrate, then forming a trench in an exposure and developing step, and then stacking a silicon oxide film ($SiO_2$ film) as an insulating film on the silicon substrate and the stopper so as to fill the stopper and the trench. The silicon oxide film was formed by a HDP (High Density Plasma) method.

The pattern wafer had a portion with a line (L) as a convex portion/a space (S) as a concave portion of 1000 μm pitch and a convex pattern density of 50% (L/S=500/500 μm); a portion with an L/S of 200 μm pitch and a convex pattern density of 50% (L/S=100/100 μm); a portion with an L/S having 100 μm pitch and a convex pattern density of 50% (L/S=50/50 μm); and a portion with an L/S having 100 μm pitch and a convex pattern density of 20% (L/S=20/80 μm).

The L/S is a simulated pattern and a pattern in which an Active portion as a convex portion masked by the silicon nitride film and a Trench portion as a concave portion with a groove formed are alternately arranged. For example, "an L/S of 100 μm pitch" means that the total of the width of the Active portion (line portion) and the Trench portion (space portion) is 100 μm. Furthermore, for example, "an L/S of 100 μm pitch and a convex pattern density of 50%" means a pattern in which a convex portion having a width of 50 μm and a concave portion having a width of 50 μm are alternately arranged.

In the pattern wafer, the film thickness of the silicon oxide film was 600 nm on each of the silicon substrate at the concave portion and the silicon nitride film on the convex portion. Specifically, as illustrated in FIG. 1, the film thickness of a silicon nitride film 2 on a silicon substrate 1 was 150 nm, the film thickness of a silicon oxide film 3 on the convex portion was 600 nm, the film thickness of the silicon oxide film 3 in the concave portion was 600 nm, and the depth of the concave portion of the silicon oxide film 3 was 500 nm (350 nm of the trench depth+150 nm of the film thickness of the silicon nitride film).

In evaluation of the pattern wafer, a known polishing liquid for CMP capable of obtaining self-stopping property (property for reducing the polishing rate in accordance with a decrease in the remaining step height in the simulated pattern) was used to polish the wafer, and a wafer in which the remaining step height was about 200 nm was used. Specifically, a wafer, which was polished until the film thickness of the silicon oxide film on the convex portion with an L/S of 100 μm pitch and a convex pattern density of 50% reached about 300 nm using a polishing liquid in which HS-8005-D4 (trade name) manufactured by Hitachi Chemical Co., Ltd., HS-7303GP (trade name) manufactured by Hitachi Chemical Co., Ltd., and water were blended in a ratio of 2:1.2:6.8, was used.

(Evaluation of blanket wafer (BTW polishing characteristics)) The polishing rate for each film to be polished (the silicon oxide film, the silicon nitride film, and the polysilicon film) of the blanket wafer polished and washed under the above conditions was determined by the equation below. The difference in film thickness of each film to be polished before and after polishing was determined using a light interference type film thickness measuring apparatus (manufactured by Filmetrics Japan, Inc., trade name: F80). Furthermore, the polishing selection ratio of the silicon oxide with respect to the silicon nitride and the polishing selection ratio of the silicon oxide with respect to the polysilicon were calculated.

(Polishing rate)=(Difference in film thickness [nm] of each film to be polished before and after polishing)/(Polishing time [min])

(Evaluation of pattern wafer (PTW polishing characteristics)) The polishing rate for the pattern wafer (PTWRR), the remaining step height amount (dishing amount), and the silicon nitride loss amount (stopper loss amount) were calculated. The remaining step height amount and the silicon nitride loss amount were calculated at a time when the stopper was exposed (the left side of the polishing time described in the table) and at a time when polishing was performed at the PTWRR for a time corresponding to about 100 nm after the stopper was exposed (the right side of the polishing time described in the table; the total polishing time from the beginning).

The polishing rate for the pattern wafer (PTWRR) was determined using the film thickness of the silicon oxide film on the convex portion before polishing in a portion with L/S=50/50 μm and the polishing time until the stopper on the convex portion was exposed, by the equation below.

(Pattern wafer polishing rate: PTWRR)=(Film thickness [nm] of the silicon oxide film on the convex portion before polishing)/(Polishing time [min] until the stopper on the convex portion is exposed)

In the pattern wafer polished and washed under the above conditions, a portion with an L/S of 1000 μm pitch and a convex pattern density of 50% (L/S=500/500 μm), a portion with an L/S of 200 μm pitch and a convex pattern density of 50% (L/S=100/100 μm), a portion with an L/S of 100 μm pitch and a convex pattern density of 50% (L/S=50/50 μm), and a portion with an L/S of 100 μm pitch and a convex pattern density of 20% (L/S=20/80 μm) were respectively scanned by a contact type step meter (trade name: P-16 manufactured by KLA-Tencor Japan), and a height difference between the convex portion and the concave portion was measured, thereby the remaining step height amount was obtained.

The silicon nitride loss amount was determined from a difference between the initial film thickness of the stopper on the convex portion and the remaining film thickness of the stopper on the convex portion after polishing, by the equation below. The film thicknesses of each film to be polished before and after polishing were determined using a light interference type film thickness measuring apparatus (trade name: Nanospec AFT-5100 manufactured by Nanometrics Incorporated).

(Silicon nitride loss amount [nm])=(Initial film thickness of the stopper on the convex portion: 150 [nm])−(Remaining film thickness [nm] of the stopper on the convex portion after polishing)

The respective measurement results obtained in Examples and Comparative Examples are shown in Tables 1 and 2.

TABLE 1

| Item | | | Example 1 | 2 | 3 | 4 | 5 | 6 | 7 | 8 | 9 |
|---|---|---|---|---|---|---|---|---|---|---|---|
| Abrasive grains | | Type | Ceria particles | | | | | | | | |
| | | Content (% by mass) | 0.3 | | | | | | | | |
| Additive | Copolymer P | Type | ST/AA | | | | | | | | |
| | | Ratio of styrene compound (mol %) | 10 | 30 | 30 | 50 | 30 | 30 | 30 | 30 | 30 |
| | | Weight average molecular weight (Mw) | 6700 | 6000 | 6000 | 3500 | 6000 | 6000 | 6000 | 6000 | 6000 |
| | | Content (% by mass) | 0.05 | 0.05 | 0.05 | 0.05 | 0.03 | 0.05 | 0.05 | 0.05 | 0.03 |
| | Phosphate compound or hydrogen phosphate compound | Type | Ammonium dihydrogen phosphate | | | | | | | | |
| | | Content (% by mass) | 0.005 | | | | | | | | |
| | Water-soluble polymer | Type | — | — | Polyglycerol | — | | | Polyglycerol | | |
| | | Content (% by mass) | | | 0.1 | | 0.1 | 0.1 | 0.1 | 0.1 | 0.1 |
| | pH adjusting agent | Type | Phosphoric acid | | | | | | | Ammonium dihydrogen phosphate | |

TABLE 1-continued

| | Item | | Example 1 | 2 | 3 | 4 | 5 | 6 | 7 | 8 | 9 |
|---|---|---|---|---|---|---|---|---|---|---|---|
| Polishing liquid characteristics | pH | | 5.5 | 5.5 | 5.5 | 5.5 | 5.5 | 6.5 | 7.5 | 6.1 | 7.2 |
| | Average particle diameter D50 (nm) | | | | | | 150 | | | | |
| | Zeta potential (mV) | | −55 | −55 | −55 | −55 | −55 | −60 | −61 | −61 | −65 |
| | Storage stability | | A | A | A | A | A | A | A | A | A |
| BTW polishing characteristics | Polishing rate | Silicon oxide film Ox (nm/min) | 168 | 153 | 168 | 164 | 172 | 168 | 203 | 233 | 235 |
| | | Silicon nitride film SiN (nm/min) | 8.7 | 5.5 | 5.1 | 2.0 | 6.1 | 5.1 | 5.6 | 7.5 | 9.2 |
| | Polishing selection ratio | Ox/SiN | 19.3 | 27.8 | 32.9 | 82.0 | 28.2 | 32.9 | 36.3 | 31.1 | 25.5 |
| PTW polishing characteristics | Polishing rate (nm/min) | | — | 250 | 286 | — | 287 | — | — | 193 | — |
| | Polishing time (s) | | — | 140 | 120 | — | 120 | — | — | 180 | — |
| | L/S = 100/100 μm | Remaining step height amount (nm) | — | 1.3 | 2.0 | — | 2.5 | — | — | 12.7 | — |
| | | SiN loss amount (nm) | — | 1.2 | 1.6 | — | 2.6 | — | — | 2.1 | — |
| | L/S = 50/50 μm | Remaining step height amount (nm) | — | 1.1 | 1.6 | — | 1.9 | — | — | 8.9 | — |
| | | SiN loss amount (nm) | — | 1.6 | 1.6 | — | 2.0 | — | — | 2.0 | — |
| | L/S = 20/80 μm | Remaining step height amount (nm) | — | 4.5 | 1.2 | — | 4.4 | — | — | 12.5 | — |
| | | SiN loss amount (nm) | — | 6.5 | 6.5 | — | 9.8 | — | — | 10.8 | — |

TABLE 2

| | Item | | Comparative Example 1 | 2 | 3 | 4 |
|---|---|---|---|---|---|---|
| Abrasive grains | Type | | Ceria particles | | | |
| | Content (% by mass) | | 0.3 | | | |
| | Copolymer P | Type | ST/AA | | | PAA |
| | | Ratio of styrene compound (mol %) | 30 | 30 | 30 | 0 |
| | | Weight average molecular weight (Mw) | 6000 | 6000 | 6000 | 2000 |
| | | Content (% by mass) | 0.05 | 0.3 | 0.01 | 0.05 |
| Additive | Phosphate compound or hydrogen phosphate compound | Type | Ammonium dihydrogen phosphate | | | |
| | | Content (% by mass) | 0.005 | | | |
| | Water-soluble polymer | Type | Polyglycerol | | | |
| | | Content (% by mass) | 0.1 | 0.1 | 0.1 | 0.1 |
| | pH adjusting agent | Type | Phosphoric acid | | | |
| Polishing liquid characteristics | pH | | 4.5 | 5.7 | 5.7 | 5.5 |
| | Average particle diameter D50 (nm) | | Aggregation | Aggregation | 150 | 150 |
| | Zeta potential (mV) | | — | — | — | — |
| | Storage stability | | B | B | A | A |
| BTW polishing characteristics | Polishing rate | Silicon oxide film Ox (nm/min) | — | — | 17 | 40 |
| | | Silicon nitride film SiN (mn/min) | — | — | 1.5 | 5.6 |
| | Polishing selection ratio | Ox/SiN | — | — | 11.3 | 7.1 |
| PTW polishing characteristics | Polishing rate (nm/min) | | — | — | 198 | — |
| | Polishing time (s) | | — | — | 180 | — |
| | L/S = 100/100 μm | Remaining step height amount (nm) | — | — | 135 | — |
| | | SiN loss amount (nm) | — | — | 46 | — |
| | L/S = 50/50 μm | Remaining step height amount (nm) | — | — | 119 | — |
| | | SiN loss amount (nm) | — | — | 46 | — |
| | L/S = 20/80 μm | Remaining step height amount (nm) | — | — | 149 | — |
| | | SiN loss amount (nm) | — | — | 100 | — |

According to Tables 1 and 2, in Examples, the results showing that the polishing selectivity of the insulating material with respect to the stopper material can be improved as compared with Comparative Examples were obtained. Furthermore, the polishing liquids of Examples were excellent in the storage stability without aggregation between the abrasive grains being generated, and in the polishing liquids of Comparative Example 1 and Comparative Example 2, aggregation between the abrasive grains was observed. Further, in Examples, the results showing that the remaining step height and the silicon nitride loss amount were sufficiently suppressed as compared with Comparative Examples were obtained.

REFERENCE SIGNS LIST

1: silicon substrate, 2: silicon nitride film, 3: silicon oxide film.

The invention claimed is:

1. A polishing liquid comprising abrasive grains, a copolymer, and a liquid medium, wherein
a zeta potential of the abrasive grains is negative,
the copolymer comprises a structure unit derived from at least one styrene compound selected from the group consisting of styrene and a styrene derivative and a structure unit derived from acrylic acid, a content of the copolymer is more than 0.01% by mass and less than 0.1% by mass based on the total amount of the polishing liquid, and a pH of the polishing liquid is more than 4.5.

2. The polishing liquid according to claim 1, wherein the pH of the polishing liquid is 7.5 or less.

3. The polishing liquid according to claim 1, further comprising a water-soluble polymer.

4. The polishing liquid according to claim 1, wherein a ratio of the structure unit derived from the styrene compound in the copolymer is 10 mol % or more.

5. The polishing liquid according to claim 1, wherein a ratio of the structure unit derived from the styrene compound in the copolymer is 50 mol % or less.

6. The polishing liquid according to claim 1, wherein the copolymer comprises a structure unit derived from styrene.

7. The polishing liquid according to claim 6, wherein the content of the copolymer is more than 0.01% by mass and less than 0.1% by mass.

8. The polishing liquid according to claim 1, wherein the abrasive grains comprise at least one selected from the group consisting of ceria, silica, alumina, zirconia, and yttria.

9. The polishing liquid according to claim 1, further comprising a hydrogen phosphate compound.

10. The polishing liquid according to claim 1, wherein a ratio of at least one group selected from the group consisting of a sulfonic acid group and a sultanate group in the copolymer is less than 5 mol%.

11. The polishing liquid according to claim 1, wherein a content of the copolymer is more than 6 parts by mass with respect to 100 parts by mass of the abrasive grains.

12. The polishing liquid according to claim 1, wherein the polishing liquid is used for polishing a surface to be polished comprising silicon oxide.

13. The polishing liquid according to claim 1, wherein a content of the abrasive grains is 1.0% by mass or less based on the total amount of the polishing liquid.

14. A polishing method comprising a step of polishing a surface to be polished by using the polishing liquid according to claim 1.

15. The polishing method according to claim 14, wherein the surface to be polished comprises silicon oxide.

16. A polishing method for a surface to be polished comprising an insulating material and silicon nitride, the polishing method comprising:

a step of selectively polishing the insulating material with respect to the silicon nitride by using the polishing liquid according to claim 1.

17. The polishing method according to claim 16, wherein the insulating material comprises silicon oxide.

18. A polishing liquid comprising abrasive grains, a copolymer, and a liquid medium, wherein the copolymer comprises a structure unit derived from at least one styrene compound selected from the group consisting of styrene and a styrene derivative and a structure unit derived from acrylic acid, a ratio of the structure unit derived from the styrene compound in the copolymer is 10 mol % or more, a content of the copolymer is more than 0.01% by mass and less than 0.1% by mass based on the total amount of the polishing liquid, and a pH of the polishing liquid is more than 4.5.

19. A polishing liquid comprising abrasive grains, a copolymer, and a liquid medium, wherein the copolymer comprises a structure unit derived from at least one styrene compound selected from the group consisting of styrene and a styrene derivative and a structure unit derived from acrylic acid, a ratio of the structure unit derived from the styrene compound in the copolymer is 50 mol % or less, a content of the copolymer is more than 0.01% by mass and less than 0.1% by mass based on the total amount of the polishing liquid, and a pH of the polishing liquid is more than 4.5.

* * * * *